United States Patent
Keck et al.

(10) Patent No.: US 6,676,916 B2
(45) Date of Patent: Jan. 13, 2004

(54) METHOD FOR INDUCING CONTROLLED CLEAVAGE OF POLYCRYSTALLINE SILICON ROD

(75) Inventors: David W. Keck, Butte, MT (US); Edward W. Osborne, Moses Lake, WA (US); Halvor Kamrud, Butte, MT (US)

(73) Assignee: Advanced Silicon Materials LLC, Moses Lake, WA (US)

( * ) Notice: Subject to any disclaimer, the term of this patent is extended or adjusted under 35 U.S.C. 154(b) by 0 days.

(21) Appl. No.: 10/290,885

(22) Filed: Nov. 8, 2002

(65) Prior Publication Data
US 2003/0104202 A1 Jun. 5, 2003

Related U.S. Application Data
(60) Provisional application No. 60/334,898, filed on Nov. 30, 2001.

(51) Int. Cl.[7] .................................................. C23C 16/24
(52) U.S. Cl. .................. 423/348; 423/349; 427/255.18; 427/255.395; 427/299; 427/309
(58) Field of Search .............................. 423/348, 349; 427/255.18, 255.395, 299, 309

(56) References Cited

U.S. PATENT DOCUMENTS

| | | | |
|---|---|---|---|
| 3,271,118 A | | 9/1966 | Bhola |
| 3,647,530 A | * | 3/1972 | Dyer .......................... 117/10 |
| 3,901,423 A | | 8/1975 | Hillberry et al. |

* cited by examiner

Primary Examiner—Timothy Meeks
(74) Attorney, Agent, or Firm—Klarquist Sparkman, LLP

(57) ABSTRACT

To avoid problems associated with the formation of unwanted cracks and spalls during the growth of a polycrystalline silicon rod, a flaw is induced in a filament on which silicon will be deposited to produce a rod. The flaw causes the grown rod to have a cleavage plane such that the rod will break in a controlled manner at a desired location. The flaw can be placed at a location selected such that breakage at the cleavage plane will produce long rods and thereby improve the yield of the rod growing process. Such a flaw will also have the effect of minimizing useable rod length losses due to spalling.

25 Claims, 2 Drawing Sheets

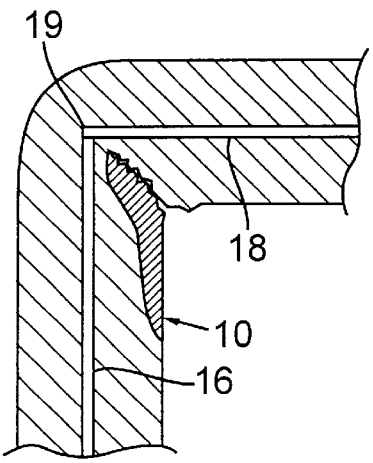
FIG. 1
PRIOR ART
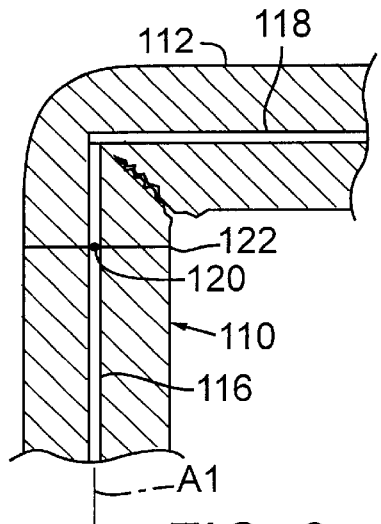
FIG. 2
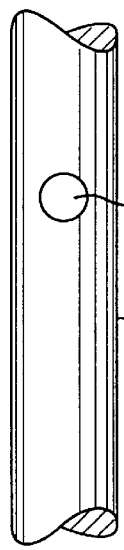
FIG. 3
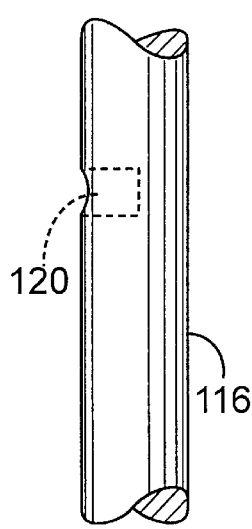
FIG. 4
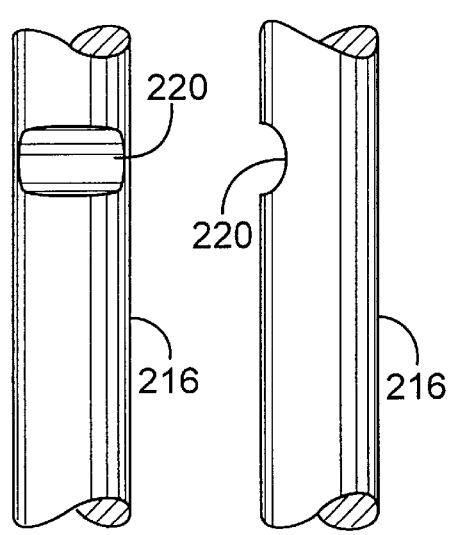
FIG. 5
FIG. 6

METHOD FOR INDUCING CONTROLLED CLEAVAGE OF POLYCRYSTALLINE SILICON ROD

CROSS REFERENCE TO RELATED APPLICATION

This claims the benefit of U.S. Provisional Application No. 60/334,898, filed Nov. 30, 2001, which provisional application is incorporated herein by reference.

BACKGROUND AND SUMMARY

The present invention relates to improving the yield of a polycrystalline silicon production system by increasing the useable length of polycrystalline silicon rods produced.

Polycrystalline silicon is a critical raw material for the electronics industry. It is the starting material for producing single crystal silicon ingots for the semiconductor industry. These ingots are produced either by the Czochralski (CZ) or Float Zone (FZ) method.

In the CZ crystal pulling process, chunks of polycrystalline silicon are loaded into a quartz crucible. The chucks of polycrystalline silicon are random size varying from 14 inches in length. In order to maximize the packaging density of the polycrystalline silicon, polycrystalline chips, granules or short rod pieces may also be added to the quartz crucible to increase the packing density. The crucible is filled, loaded into the CZ furnace and the polycrystalline silicon is melted.

Upon melting, due to interstices among the polycrystalline silicon pieces packed in the crucible, 20–30% of the crucible volume is unfilled. This can have a significant impact on the overall yield of the CZ process. In order to maximize the yield of single crystal silicon from the melt, there is a variety of options to top off the crucible and thus increase the silicon melt volume. Small chunks, chips or granular polycrystalline silicon can be added via a quartz tube. These sources have a much higher surface area than the initial polycrystalline silicon chunk and therefore have a higher potential to add surface contaminates to the melt. In addition, many CZ single crystal silicon growers have difficulty obtaining good yield if they add more than 10–20% of the total weight of the charge as granular polycrystalline silicon.

An alternative method has been to use polycrystalline rods to top off the crucible. This process is commonly referred to as charge replenishment (CR). CR rods are typically <900 mm in length and tip to 35–40 kg in weight.

In the FZ method, rods of polycrystalline silicon are converted into single crystal by float zoning. The FZ process is a crucible-free process in which a polycrystalline silicon rod is melted using a RF field, which acts as the energy source, as well as the containment field. This results in the ability to melt the polysilicon and grow single crystal silicon without the use of a crucible. Typically, in the FZ process, polycrystalline rods of 1500–2000 mm in length and 75–150 mm in diameter are loaded into the FZ puller and single crystal ingots of 75–150 mm in diameter and >1500 mm in length are produced.

In the FZ process a critical parameter for yield, particularly for 125 mm or greater diameter ingots, is the availability of large diameter, full-length polycrystalline silicon rods. These polycrystalline silicon rods need to be similar in diameter and length to the ingots to be pulled in order to maximize yield. Most of the major FZ ingot growers who produce greater than 125 mm diameter ingots use equipment designed to pull >2000 mm length ingots, therefore, the polycrystalline silicon rods must be similar in length or greater depending on diameter to optimize yield of single crystal.

Polycrystalline silicon rods for both the FZ and CR applications must be free of surface cracks and spalls. Cracks can cause the rods to break during processing due to thermal as well as internal stresses. Such breakage can cause extensive damage and down time to the crystal growing equipment. Spalls, depending on size and location, are also detrimental to the process. This is due to the potential for cracks to be associated with the spalling. In addition, the loss of mass associated with spalls can impact the quantity of single crystal produced. In large diameter polysilicon rod production, spalling is the major failure mechanism.

In FZ applications, the geometric relationship between the polysilicon rod and RF coil needs to be very consistent in order to achieve acceptable product quality and yields. Due to the critical nature of this relationship, spalls on virgin polysilicon rods must be completely removed in order to be acceptable for use in the FZ process.

In CR applications some spalling can be tolerated. However, due to physical constraints within the CZ pulling equipment it is desirable to have consistent rod length-to-mass ratios. Rod spalls lead to variability in the rod length/mass ratios that must be compensated for during processing, which can lead to reduced productivity.

The production of polycrystalline silicon rods by the pyrolytic decomposition of a gaseous silicon compound, such as silane or a chlorosilane, on a suitable substrate is a well-known process. The process typically comprises:

a) An even number of electrodes are attached to a base plate, each electrode can have a starting filament (starter rod) attached. The filament is on the order of 2000 mm in length.

b) The filaments are joined in pairs by connecting bridges. Each bridge is a piece of starter rod material and is joined to two starting filaments. Each set of two filaments and a bridge thus is a generally an inverted U-shaped member, commonly referred to as a hairpin. For each hairpin assembly, an electrical pathway is formed between a pair of electrodes within the reactor. An electrical potential applied to the electrodes can thus heat the attached hairpin resistively.

c) The hairpins arc contained in a bell jar enclosure that mates with the base plate to define a batch reactor allowing operation under vacuum or positive pressure conditions.

d) A gaseous silicon precursor compound of the desired semiconductor material and other gases, as necessary, are fed into the reactor.

e) The U-shaped members are electrically heated to a temperature sufficient to effect decomposition of the gaseous precursor compound and simultaneous deposition of the semiconductor material onto the hairpins, thereby producing U-shaped polysilicon rods of substantial diameter.

f) Any by-product gases and unreacted precursor compounds are exhausted from the reactor.

The principles of design of present state of the art reactors for the pyrolysis of silane and chlorosilanes are set forth in, for example; U.S. Pat. Nos. 4,150,168; 4,179,530; 4,724,160; and 4,826,668, each of which is incorporated herein by reference. The length of the polycrystalline rod that can be grown in a reactor is limited by the geometry of the reactor, height of the enclosure, length of the filament and the reactor power supply.

The temperature of this process is carefully controlled in order to reduce the amount of stress in the rods as they grow.

Unfortunately, at each filament-bridge junction region there is generated a large amount of radiant energy that is exchanged between the filament and the bridge. This results in a large amount of induced stress in the rod. The amount of stress increases significantly as the rods become larger in diameter.

This stress can become great enough to cause the rods to fracture in this region upon cooling. This fracture is typically a spall that can be 100–500 mm in length. This reduces the available length of useable rod by almost the same length as the spall. Thus in many cases, the rod can no longer be processed for the FZ process and may not be useable for the CR rod process. If CR rod length is <900 mm then the optimum yields for the polycrystalline silicon manufacturer is to produce two CR rods per polycrystalline rod. Spalling of the rods in the reactor can greatly impact this yield.

Thus there is a need to reduce the impact of spalling and to improve the yield of the silicon deposition process. This is accomplished by a process that increases useable rod length, eliminates the need to saw the rod to desired length, and/or eliminates the need to etch the rod pieces to remove the contamination from sawing.

BRIEF DESCRIPTION OF THE DRAWINGS

FIG. 1 is a cross-sectional elevational view of the bridge and filament junction region of a polycrystalline silicon rod produced by deposition of silicon on a filament by pyrolytic decomposition of a gaseous silicon compound.

FIG. 2 is a cross-sectional elevational view of the bridge and filament junction region of another polycrystalline silicon rod produced by deposition of silicon on a filament by pyrolytic decomposition of a gaseous silicon compound, with the rod having an induced cleavage plane.

FIG. 3 is a partial front elevational view of a filament that has a radial hole that extends partially therethrough.

FIG. 4 is a partial right side elevational view of the filament of FIG. 3.

FIG. 5 is a partial front elevational view of a filament that has a transversely extending notch.

FIG. 6 is a partial right side elevational view of the filament of FIG. 3.

DETAILED DESCRIPTION

Figures 7, 8, 9:
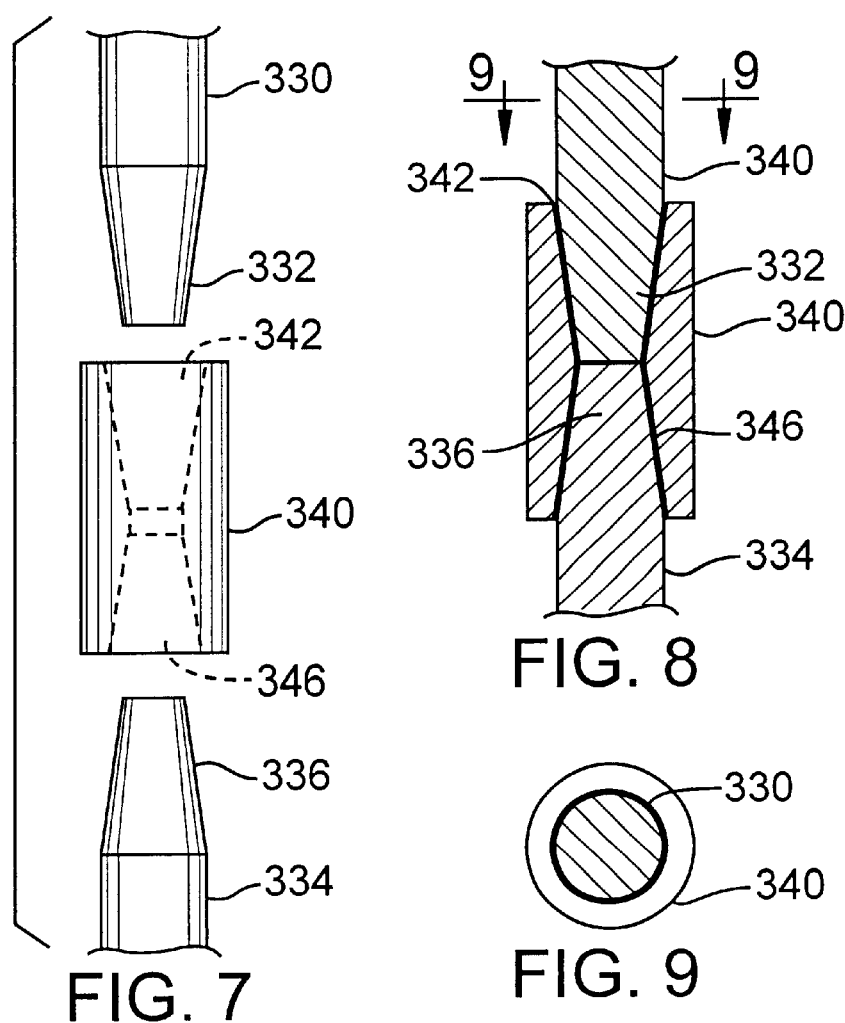
FIG. 7 is an exploded elevational view of two vertically extending filament portions and a connector sleeve.
FIG. 8 is a partial vertical cross-sectional view of the vertical filament portions and connector of FIG. 7, with the two filament portions received in the connector sleeve.
FIG. 9 is a horizontal cross-sectional view taken along line 9—9 of FIG. 8.

To avoid problems associated with the formation of unwanted cracks and spalls, a flaw is induced in a filament on which silicon will be deposited to produce a polycrystalline rod. The flaw, induced prior to growth of the rod, causes the grown rod to have a cleavage plane such that the rod will break in a controlled manner at a desired location. The flaw can be induced at a location selected such that breakage at the cleavage plane will produce long rods and thereby improve the yield of the rod growing process. Such an induced flaw will also have the effect of minimizing useable rod length losses due to spalling.

As discussed below, filaments that are used as substrates for the growth of polycrystalline silicon rods may be made in several ways, may have different cross-section shapes, and may be made of various materials, depending on their intended uses. Typically all such filaments are of a substantially uniform cross-section along their entire lengths and have one or more outer surfaces that are elongated and continuous.

For the purpose of this disclosure, a flaw is any disruption in a surface of a filament that is sufficient to act as a cleavage initiation site for silicon deposited on the filament by a chemical vapor deposition process. Several types of disruptions can act as cleavage initiation sites, as will be understood by the following discussion and accompanying drawings.

Filaments having such flaws at desired locations are installed inside a reactor. The filaments are then heated and a silicon-bearing gas is supplied inside the reactor in the region of the filaments. Polycrystalline silicon deposits on the heated filaments by chemical vapor deposition of silicon due to thermal decomposition of the silicon-bearing gas. The resulting polycrystalline silicon rods having cleavage planes at the locations of the flaws.

FIG. 1 shows a cross-sectional view of the bridge-rod region of a growing polysilicon rod 10. A pair of generally vertically extending silicon starter filaments 16 (one shown) are connected to each other at their upper ends through a silicon filament bridge 18 to provide a hairpin on which a generally U-shaped rod 10 is formed. Each of the starter filaments 16 and bridge 18 is a solid silicon rod having an outer surface that is generally cylindrical, smooth, and continuous for its entire length. At the insides of the corners 19 where the filaments 16 and bridge 18 meet, vertical and horizontal portions of the surface of the growing rod are in close proximity and a large amount of radiant energy is exchanged. This causes the surface of the growing rod 10 to have excessive surface temperature where the rod and bridge portions view one another. This excessive temperature causes induced stresses which, upon cooling, can result in fracturing or spalling of the grown polycrystalline silicon rod 10. This spalling has a higher frequency of occurrence as the polycrystalline silicon rod diameter increases. The spalling reduces the useable length of the rod 10 for FZ and CR rod applications.

FIG. 2 shows a rod 10 having a bridge portion 118. The rod is formed on a filament that includes a vertically extending starter filament 116 and a bridge filament 118. The starter filament 116 has a flaw 120 below the bridge-filament connection. The flaw has little to no effect on growth of the rod 110. But upon cooling, the flaw 120 can serve as an initiation site for the rod 110 to cleave along a cleavage plane 122. This cleavage plane 122 extends generally perpendicular to the axis $A_1$ of the polycrystalline silicon rod 110. The presence of such a cleavage initiation site, located at an elevation above the elevation of the bottom of a typical spall, greatly reduces spalling and therefore increases the length of usable rod produced.

The flaw induced into the filament 116 can be any of several types. The flaw can either be imparted directly into to the starting filament, the connecting bridge or be an additional piece of non-contaminating material held in a static position along the starting filament. For example, the flaw can be caused by: 1) drilling a hole into a filament, 2)

scoring or sawing the surface of a filament, 3) using a silicon coupler or ring that extends around at least a portion of a filament, 4) providing a collar or ferrule that joins separate segments of a filament, 5) intentionally imparting an aberration at a desired location on a filament during manufacture, such as by temporarily altering conditions during FZ pulling of a filament, 6) depositing material on or near the surface of a filament resulting in changes to deposition characteristics, or 7) placing cracks or fissures in a filament. Certain other types of flaws will also produce the desired effect.

FIGS. 3–4 show an example of a flaw 120 that is a hole drilled partially through a filament 116. The illustrated hole extends generally radially, but the orientation of the hole axis and location of the hole are not critical to success provided that the hole is not so large as to unduly weaken the filament.

FIGS. 5–6 show an example of a flaw that is a notch 220 cut transversely into the side of a filament 216. The size and method of formation of such a notch is not critical, so long as the notch does not unduly weaken the filament. However, it is advantageous for the notch to have a sharp corner or edge. When a notch or other flaw has a sharp corner or edge, it more likely will induce a cleavage plane than a flaw that lacks a sharp corner or edge.

FIGS. 7–9 show an example of a flaw that is provided by a sleeve-type coupler. In this example, a vertical filament has at least two segments. These include an upper segment 330 that has a lower end portion 332 and that extends upwardly from the location of the flaw. A lower segment 334 has an upper end portion 336 and extends downwardly from the location of the flaw. The end portions 332, 336 of the illustrated segments 330, 334 are generally circular in cross-section and are tapered or generally truncated cones. The end portions 332, 336 are received in a sleeve connector 340 that is constructed of a non-contaminating material and that defines upper and lower cavities 342, 346 shaped and sized to receive the end portions 332, 336 respectively. The connector 340 is retained by friction or interference at a static location.

Figures 10, 11, 12:
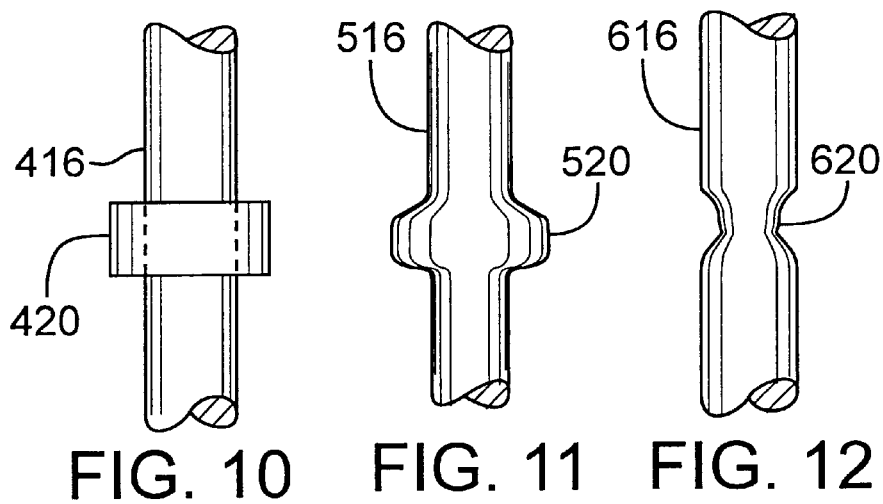
FIG. 10 is a partial front elevational view of a filament that has a surrounding collar.
FIG. 11 is a partial front elevational view of a filament that has a bulge.
FIG. 12 is a partial front elevational view of a filament that has a neck portion of reduced diameter.

FIG. 10 shows an example of a flaw that is provided by a collar 420 that is mounted to surround a filament. The collar 420 is retained by friction or interference at a static location, FIGS. 11 and 12 show examples of flaws that are diameter variations formed during the production of the illustrated filaments. The filament 516 of FIG. 11 has a flaw that is an over-sized area or bulge 520. The filament 616 of FIG. 12 has a flaw that is an under-sized area or neck 620. Such aberrations in the surface of a filament can be induced during the filament's manufacture. The flaws illustrated in FIGS. 11 and 12 are most easily made during the formation of filaments pulled from molten silicon using a FZ technique. During the FZ process, the speed of the pull can be decreased or increased at an appropriate time to form a bulge or neck of the type illustrated.

Although the illustrated filaments all are shown as having a circular cross-section as is characteristic of filaments formed by FZ techniques, it should be understood that suitable filaments can be made is a variety of other ways and can have other cross-section shapes. Filaments can be made, for example, by cutting a full-sized polycrystalline silicon rod into multiple filaments, each having a 7 mm×7 mm square cross-section. A filament having a generally octahedral cross-section can be made by removing the edge portions of a filament initially cut to have a square or parallelogram cross-section. Other cross-section shapes can be used. Not all filaments are made of pure silicon. Filaments can be made of silicon that contains other materials or can be made entirely of another material. Particularly suitable are high-melting point metals having good electrical conductivity such as tungsten or tantalum.

Regardless of type, a flaw 120 should be located as near to the bridge filament 118 as possible to produce rods of the longest possible length. But the flaw must be located at least a small distance below the bridge or the resulting rod may not cleave in a generally horizontal manner. Good results have been achieved when a flaw is located from 50 to 150 mm below the bridge 118. The optimum location will vary depending upon the diameter of the rod to be grown and upon reactor conditions during rod growth. By experimentation, it is possible to determine for a particular diameter of rod and set of reactor conditions, where to position the flaw relative to the upper end of a starter filament so as to achieve the longest possible rod that will cleave generally perpendicularly to the rod axis $A_1$.

Regardless of type, the flaw must be of sufficient size to cause the fully-grown polycrystalline rod to cleave cleanly and predictably. Additionally, the induced flaw must not cause the rod to break during rod growth or during normal production operations. The size and shape requirements for the flaw depend on the amount of induced stress that will occur within the rod. This stress depends on the polycrystalline silicon rod growing conditions, diameter and reactor geometry. The amount of stress varies generally directly with finished rod diameter. Thus large diameter rods typically have a relatively high amount of stress and require a relatively small filament flaw to establish a suitable cleavage initiation site. Smaller diameter rods have less stress and require a larger filament flaw to establish a suitable cleavage initiation site. The exact flaw size and shape must be determined for each reactor geometry and set of growth parameters.

One or more additional flaws (not shown) can be induced along the length of a filament. This would allow for the polycrystalline silicon rod to be cleaved into several pieces of predetermined length. In this manner, short polycrystalline silicon rod sections could be produced. This could also reduce the need for sawing the polycrystalline silicon rod into short pieces and the cost of etching of the short rod pieces to remove contamination from the sawing process, Thus, by inducing a flaw in a filament in the region of the filament-bridge connection, it is possible to cause the resulting rod to fracture generally perpendicularly to the axis of the rod at an elevation above the elevation of the bottom of the spall that otherwise likely would occur.

EXAMPLE

It was desired to grow 138 mm diameter rods approximately 1550 mm in length in a Siemens reactor using silane as the source gas.

In order to make the resulting rods fracture satisfactorily at a specific location, a 0.5 mm hole was machined into each of several 7-mm starter rods that were 2200 mm long.

The hole was approximately 2.5 mm in depth. For this test, the flaw was located 100 mm below the bridge end of each starter rod.

After the growth cycle, all the resulting 138-mm diameter rods broke cleanly. In nearly all cases, the fracture plane was directly through the flaw. Among fifteen rods that were grown on filaments having the induced flaw, there was a single spall 240 nm in length.

In comparison, seventeen rods grown on similar filaments, but without induced flaws, had ten spalls averaging 224 mm in length with a standard deviation of 253 mm. Available rod length thus was increased by an average of 72 mm when using flawed filaments.

It will be apparent to those having ordinary skill in the art that changes can be made to the above-described embodiments. For example, a Siemens reactor using silane as the source gas is described above as one preferred system, but a like benefit may be obtained using other source gasses and reactor systems. Accordingly, for the purpose of this disclosure, the term "silicon-bearing gas" is intended to mean any gas of the group of consisting of silane ($SiH_4$), dichlorosilane ($SiH_2Cl$), trichlorosilane ($SiHCl_3$), silicon tetrachloride ($SiCl_4$), dibromosilane ($SiH_2Br_3$), tribromosilane ($SiHBr_3$), silicon tetrabromide ($SiBr_4$), diiodosilane ($SiH_2I_2$), triiodosilane ($SiHI_3$), silicon tetraiodide ($SiI_4$), and mixtures thereof. The term "silicon-bearing gas" also refers to "higher ordered" silanes, which for the purpose of this disclosure include silane ($SiH_4$), disilane ($Si_2H_6$) and trisilane ($Si_3H_8$), and also refers to gas mixtures that contain one or more higher ordered silanes. Diluent gasses, such as hydrogen ($H_2$), may be present in the gas mixture in the reactor. Such diluent gasses should not be of the type that would leave a contaminating residue on a growing silicon rod.

The scope of the invention should be determined by the following claims.

What is claimed is:

1. A method for making a polycrystalline silicon rod, the method comprising:

installing a hairpin, comprising two generally vertically extending starting filaments joined near the top by a connecting bridge with at least one of the filaments having at least one flaw at a desired location below the bridge, inside a reactor;

heating the hairpin;

supplying a silicon-bearing gas inside the reactor; and depositing polycrystalline silicon on the heated hairpin by chemical vapor deposition of silicon due to thermal decomposition of the silicon-bearing gas to form at least one polycrystalline silicon rod having a cleavage plane at the location of the at least one flaw.

2. The method of claim 1 wherein the flaw is a hole drilled into the at least one of the filaments.

3. The method of claim 1 wherein the flaw is a notch inscribed into the surface of the at least one of the filaments.

4. The method of claim 1 wherein the flaw is a separate collar that is retained by friction or interference at a static location along the at least one of the filaments.

5. The method of claim 1 where the flaw is a ferrule that is retained by friction or interference at a static location along the at least one of the filaments.

6. The method of claim 1 where the flaw is an aberration on the at least one of the filaments.

7. The method of claim 1 where the flaw is a deposit of material on or near the surface of the at least one of the filaments, which deposit results in a change to deposition characteristics.

8. The method of claim 1 where the flaw is a crack or fissure in the at least one of the filaments.

9. The method of claim 1, wherein the method is for making a polycrystalline silicon rod of a predetermined length, further comprising:

providing the at least one flaw in the at least one of the filaments at a location selected such that the at least one rod will be of the predetermined length upon cleavage at the location of the flaw; and after the depositing of polycrystalline silicon on the at least one filament, cleaving the at least one rod at the location of the flaw.

10. The method of claim 9 further comprising:

providing a plurality of spaced-apart flaws in the at least one of the filaments, which flaws are sufficient to establish a plurality cleavage planes in the at least one rod grown on the at least one of the filaments; and cleaving the at least one rod at each cleavage plane.

11. The method of claim 1 wherein the at least one flaw comprises a located from 50 to 150 mm below the bridge.

12. A method for making a polycrystalline silicon rod, the method comprising:

providing a silicon filament that has a collar retained by friction or interference at a static location along the silicon filament;

installing the silicon filament inside a reactor;

heating the silicon filament;

supplying a silicon-bearing gas inside the reactor; and depositing polycrystalline silicon on the heated filament by chemical vapor deposition of silicon due to thermal decomposition of the silicon-bearing gas to form a polycrystalline silicon rod having a cleavage plane at the location of the collar.

13. A method for making a polycrystalline silicon rod, the method comprising:

providing a silicon filament that has a ferrule retained by friction or interference at a static location along the silicon filament;

installing the silicon filament inside a reactor;

heating the silicon filament;

supplying a silicon-bearing gas inside the reactor; and depositing polycrystalline silicon on the heated filament by chemical vapor deposition of silicon due to thermal decomposition of the silicon-bearing gas to form a polycrystalline silicon rod having a cleavage plane at the location of the ferrule.

14. A method for making a polycrystalline silicon rod of a predetermined length, the method comprising:

providing a silicon filament that has a plurality of spaced-apart flaws at desired locations along the silicon filament;

installing the silicon filament inside a reactor;

heating the silicon filament;

supplying a silicon-bearing gas inside the reactor;

depositing polycrystalline silicon on the heated filament by chemical vapor deposition of silicon due to thermal decomposition of the silicon-bearing gas to form a polycrystalline silicon rod having cleavage planes at the locations of the flaws; and cleaving the rod at each cleavage plane such that at least one portion of the cleaved rod will be of a predetermined length due to the location of the flaws.

15. A method for making a polycrystalline silicon rod, the method comprising:

providing a filament having at least one flaw at a desired location along the filament, the flaw being of sufficient size to establish a cleavage plane at the location of the flaw in a polycrystalline silicon rod grown by depositing silicon on the filament;

installing the filament inside a reactor;

heating the filament;

supplying a silicon-bearing gas inside the reactor; and depositing polycrystalline silicon on the heated filament by chemical vapor deposition of silicon due to thermal decomposition of the silicon-bearing gas to form a polycrystalline silicon rod having a cleavage plane at the location of the flaw; and after the depositing of polycrystalline silicon on the heated filament, cleaving the rod at the location of the flaw.

16. The method of claim 15 wherein the flaw is a hole drilled into the at least one of the filaments.

17. The method of claim 15 wherein the flaw is a notch inscribed into the surface of the at least one of the filaments.

18. The method of claim 15 wherein the flaw is a separate collar that is retained by friction or interference at a static location along the at least one of the filaments.

19. The method of claim 15 wherein the flaw is a ferrule that is retained by friction or interference at a static location along the at least one of the filaments.

20. The method of claim 15 wherein the flaw is an aberration on the at least one of the filaments.

21. The method of claim 15 wherein the flaw is a deposit of material on or near the surface of at least one of the filaments, which deposit results in a change to deposition characteristics.

22. The method of claim 15 wherein the flaw is a crack or fissure in the at least one of the filaments.

23. The method of claim 18, wherein the method is for making a polycrystalline silicon rod of a predetermined length, further comprising providing the at least one flaw at a location selected such that the rod will be of the predetermined length upon cleavage at the location of the flaw.

24. The method of claim 15 further comprising:

providing a plurality of spaced-apart flaws in the filament, which flaws are sufficient to establish a plurality cleavage planes in the rod grown on the filament; and cleaving the rod at each cleavage plane.

25. The method of claim 15 wherein the at least one flaw comprises a flaw located from 50 to 150 mm below the bridge.

* * * * *

UNITED STATES PATENT AND TRADEMARK OFFICE
CERTIFICATE OF CORRECTION

PATENT NO. : 6,676,916 B2
APPLICATION NO. : 10/290885
DATED : January 13, 2004
INVENTOR(S) : David W. Keck, Edward W. Osborne and Halvor Kamrud It is certified that error appears in the above-identified patent and that said Letters Patent is hereby corrected as shown below:

In the Specification:

Column 1, line 22, "chucks" should be --chunks--.

Column 1, line 40, "contaminates" should be --contaminants--.

Column 2, line 43, "hairpins arc" should be --hairpins are--.

Column 4, line 26, "having cleavage" should be --have cleavage--.

Column 4, lines 63-64, "directly into to" should be --directly to--.

Column 5, line 45, "location," should be --location.--.

Column 5, line 61, "is a variety" should be --in a variety--.

Column 6, line 40, "process," should be --process.--.

Column 6, line 67, "240 nm" should be --240 mm--.

Column 7, line 13, "group of consisting" should be --group consisting--.

Column 7, line 15, "$SiH_2Br_3$" should be --$SiH_2Br_2$--.

In the Claims:

Column 8, line 13 (claim 11), "comprises a located" should be --comprises a flaw located--.

Column 10, line 7 (claim 23), "claim 18," should be --claim 15--.

UNITED STATES PATENT AND TRADEMARK OFFICE
CERTIFICATE OF CORRECTION

PATENT NO. : 6,676,916 B2
APPLICATION NO. : 10/290885
DATED : January 13, 2004
INVENTOR(S) : David W. Keck, Edward W. Osborne and Halvor Kamrud It is certified that error appears in the above-identified patent and that said Letters Patent is hereby corrected as shown below:

In the Claims (continued):

Column 10, lines 14-15 (claim 24), "plurality cleavage" should be --plurality of cleavage--.

Signed and Sealed this

Fifteenth Day of January, 2008

JON W. DUDAS
*Director of the United States Patent and Trademark Office*